(12) United States Patent
Noda et al.

(10) Patent No.: US 8,711,895 B2
(45) Date of Patent: Apr. 29, 2014

(54) SURFACE-EMITTING LASER LIGHT SOURCE USING TWO-DIMENSIONAL PHOTONIC CRYSTAL

(75) Inventors: Susumu Noda, Uji (JP); Eiji Miyai, Kyoto (JP); Dai Ohnishi, Otsu (JP)

(73) Assignees: Kyoto University, Kyoto (JP); Rohm Co., Ltd., Kyoto (JP)

(*) Notice: Subject to any disclaimer, the term of this patent is extended or adjusted under 35 U.S.C. 154(b) by 0 days.

(21) Appl. No.: 13/137,693

(22) Filed: Sep. 2, 2011

(65) Prior Publication Data
US 2012/0002692 A1 Jan. 5, 2012

Related U.S. Application Data

(62) Division of application No. 11/991,403, filed as application No. PCT/JP2006/317486 on Sep. 5, 2006, now abandoned.

(30) Foreign Application Priority Data

Sep. 5, 2005 (JP) .................. 2005-255878
Dec. 27, 2005 (JP) .................. 2005-374208

(51) Int. Cl.
*H01S 5/183* (2006.01)

(52) U.S. Cl.
USPC ............. 372/50.124; 372/43.01; 372/45.01; 372/50.11

(58) Field of Classification Search
USPC ........................... 372/43.01, 50.124
See application file for complete search history.

(56) References Cited

U.S. PATENT DOCUMENTS 6,711,200 B1 * 3/2004 Scherer et al. .......... 372/64
6,744,804 B2 6/2004 Deng et al.
(Continued)

FOREIGN PATENT DOCUMENTS

EP 1 566 671 A1 8/2005
EP 1 610 427 A1 12/2005
(Continued)

OTHER PUBLICATIONS

Chinese Patent Office, Office Action for Chinese Patent Application No. 200680032312.4 (with English translation) issued Mar. 10, 2010, pp. 1-3.
(Continued)

*Primary Examiner* — Xinning Niu
(74) *Attorney, Agent, or Firm* — Oliff PLC.

(57) ABSTRACT

The present invention intends to provide a surface-emitting laser light source using a two-dimensional photonic crystal in which the efficiency of extracting light in a direction perpendicular to the surface is high. In a laser light source provided with a two-dimensional photonic crystal layer created from a plate-shaped matrix body in which a large number of holes are periodically arranged and an active layer arranged on one side of the two-dimensional photonic crystal layer, the holes are created to be columnar with a predetermined cross-sectional shape such as a circular shape, and the main axis of each of the columnar holes is tilted to a surface of the matrix body. When provided with this two-dimensional photonic crystal layer, the surface-emitting laser source using a two-dimensional photonic crystal has a $Q_\perp$ value (i.e. a Q value in a direction perpendicular to the surface) of several thousands, which is suitable for an oscillation of laser light, and the efficiency of extracting light is high in the direction perpendicular to the surface.

10 Claims, 11 Drawing Sheets

(56) References Cited

U.S. PATENT DOCUMENTS

| | | | |
|---|---|---|---|
| 6,810,056 B1* | 10/2004 | Lipson et al. | 372/46.01 |
| 6,826,223 B1 | 11/2004 | Meyer et al. | |
| 6,829,281 B2 | 12/2004 | Deng et al. | |
| 2002/0088769 A1* | 7/2002 | Antaki et al. | 216/59 |
| 2002/0163947 A1 | 11/2002 | Ostergaard et al. | |
| 2003/0235229 A1* | 12/2003 | Deng et al. | 372/96 |
| 2004/0247009 A1* | 12/2004 | Noda et al. | 372/99 |
| 2005/0089075 A1 | 4/2005 | Baba et al. | |

FOREIGN PATENT DOCUMENTS

| | | |
|---|---|---|
| EP | 1 724 887 A1 | 11/2006 |
| JP | A 2000-031587 | 1/2000 |
| JP | A 2000-332351 | 11/2000 |
| JP | A 2003-273455 | 9/2003 |
| JP | A 2004-111766 | 4/2004 |
| JP | A 2004-296538 | 10/2004 |
| JP | A 2005-159272 | 6/2005 |
| WO | WO 03/005513 A1 | 1/2003 |
| WO | WO 2005/008305 A1 | 1/2005 |

OTHER PUBLICATIONS

Y. Tanaka et al., "Theoretical Investigation of a Vertical Asymmetric Photonic Crystal Slab," The $5^{th}$ Pacific Rim Conference on Lasers and Electro-Optics, 2003, vol. 2, p. 402.

Eiji Miyai et al., "2 Gigen Photonic Kesshomen Hakko Lasers on Mengai Ketsugo Koritsu Seigyo," Dai 66 Kai Extended abstracts; the Japan Society of Applied Physics, separate vol. 3 (2005), p. 922, 9p-H-5.

Hikari Yokohama et al., "FDTD-ho ni yoru 2 Gigen Seiho Koshi Photonic Kessho Lasers no Kaiseki (V)," Dai 52 Kai Extended abstracts; the Japan Society of Applied Physics, separate vol. 3 (2005), p. 1201, 31a-YV-4.

Noda et al., "Polarization Modce Control of Two-Dimension Photonic Crystal Laser by Unit Cell Structure Design," Science, Aug. 10, 2001, vol. 293; American Association for the Advancement of Science, Washington D.C.

European Patent Office, Supplementary European Search Report for EP 0678 3175, May 12, 2011, pp. 1-11.

\* cited by examiner

<FIRST COMPARATIVE EXAMPLE>

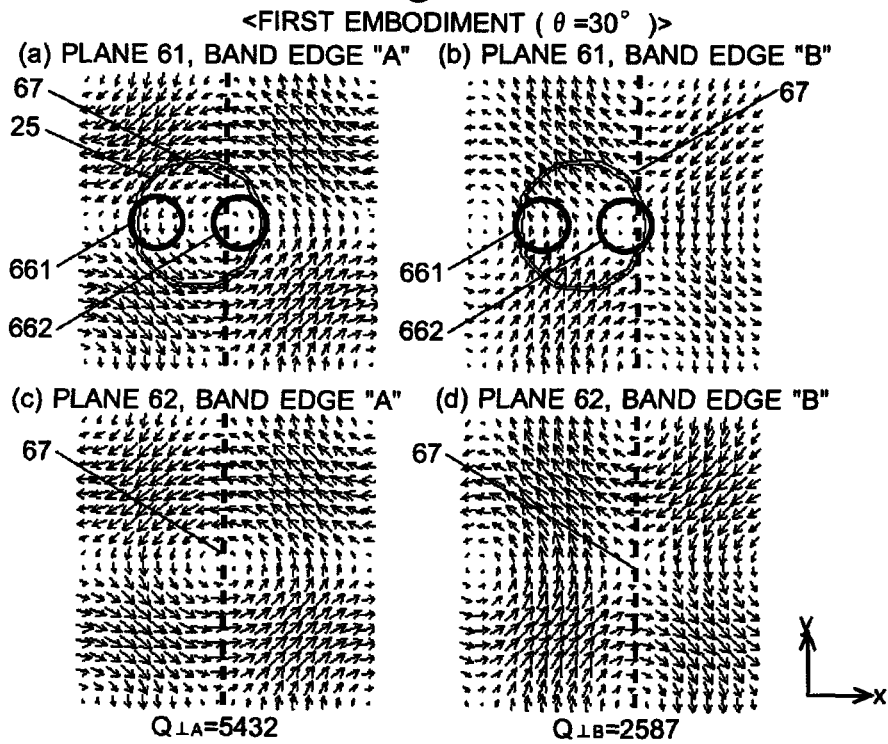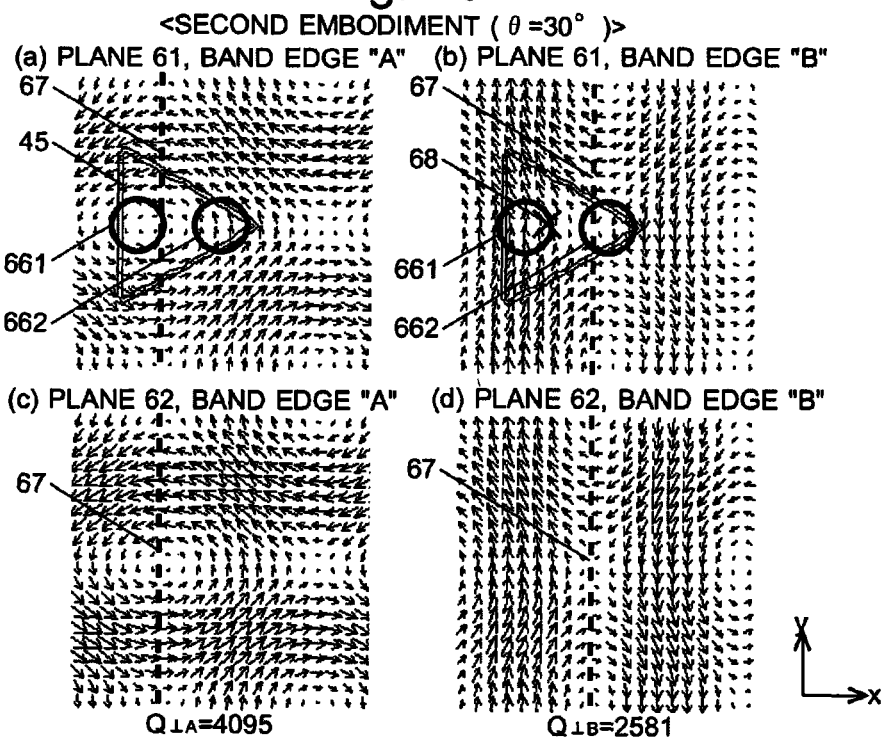

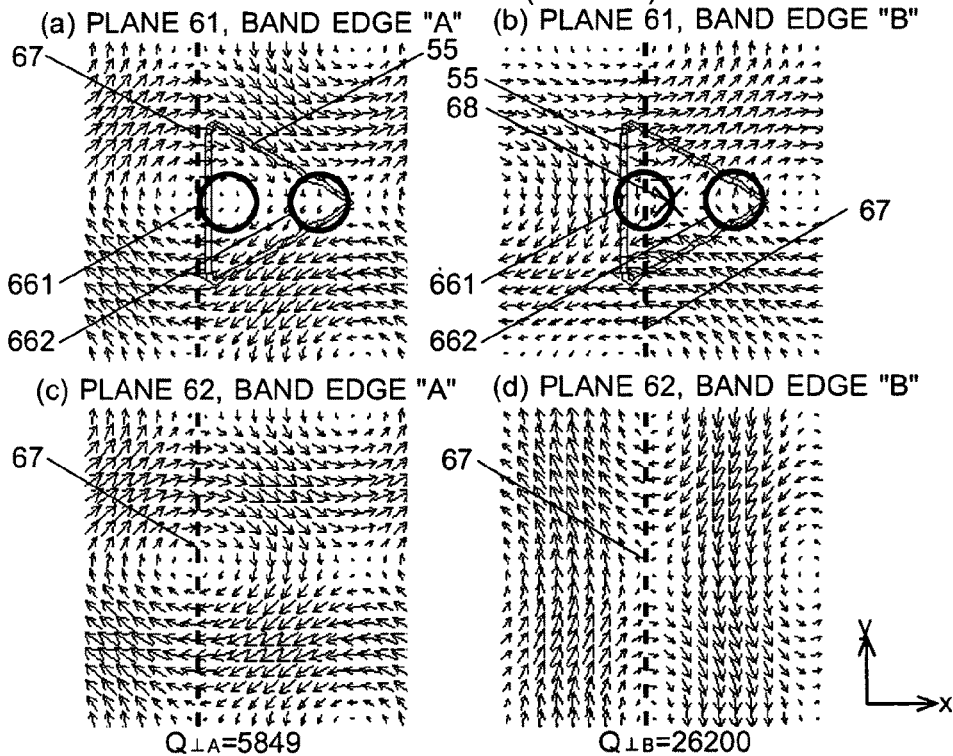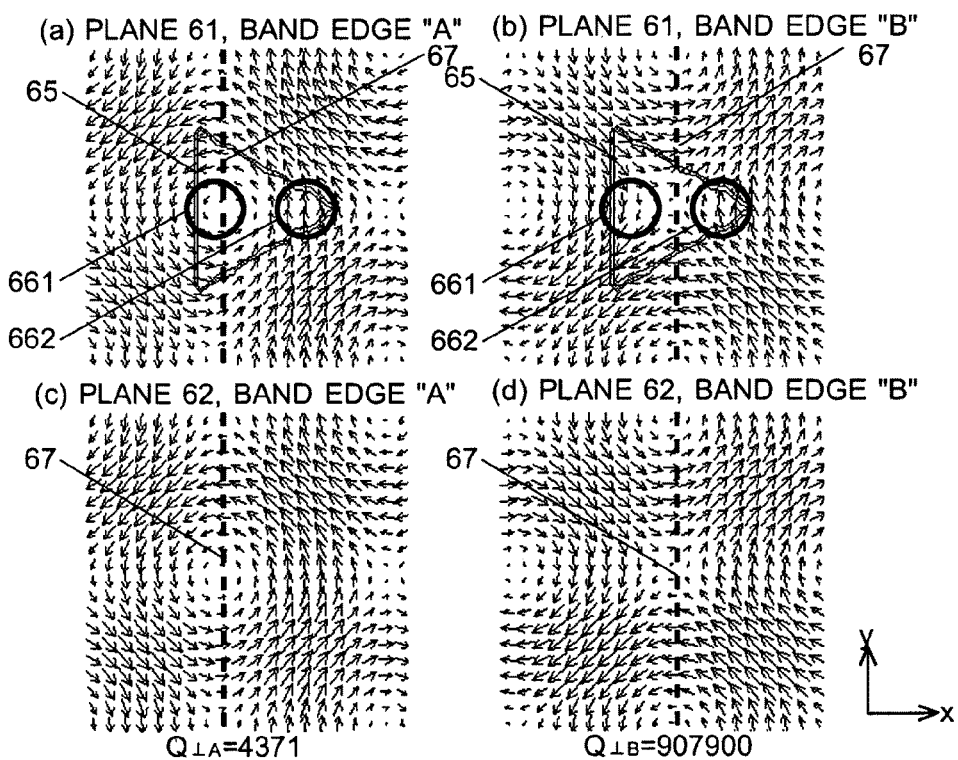

Fig. 16
(a)
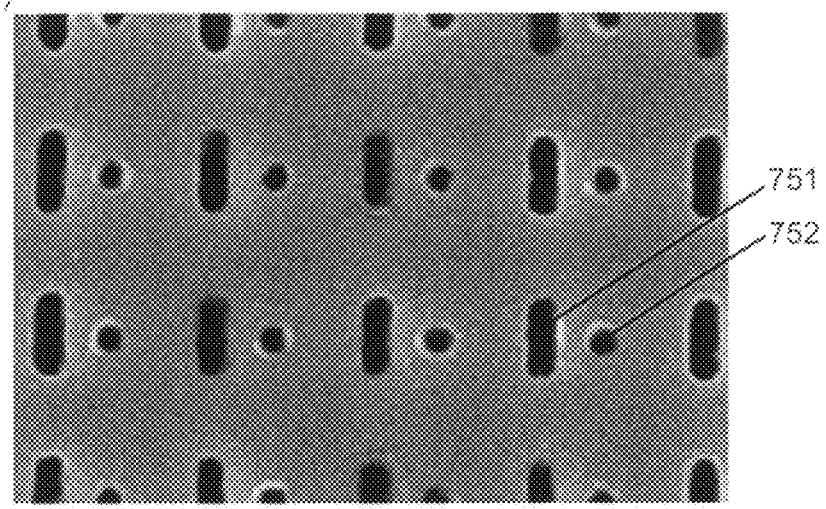
(b)
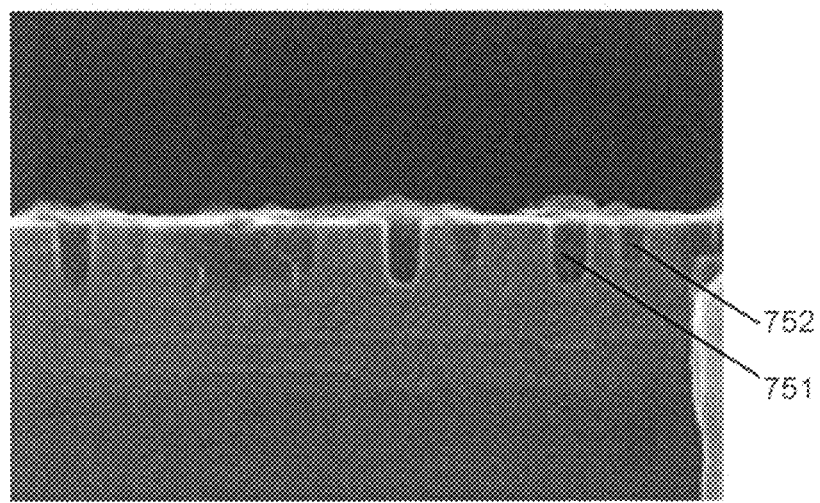

Fig. 17
(a) FOURTH EMBODIMENT
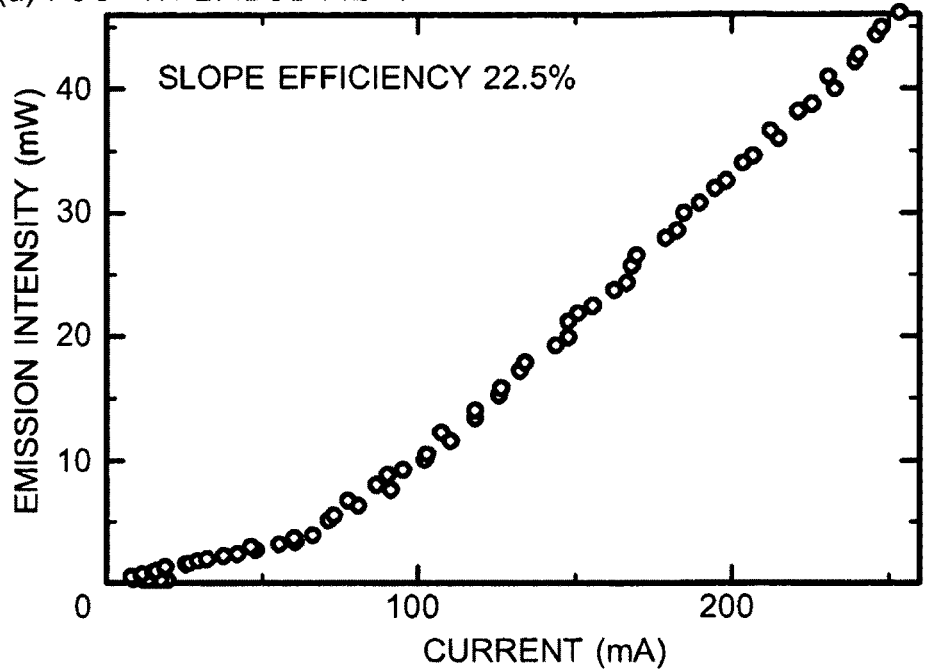
(b) SECOND COMPARATIVE EXAMPLE
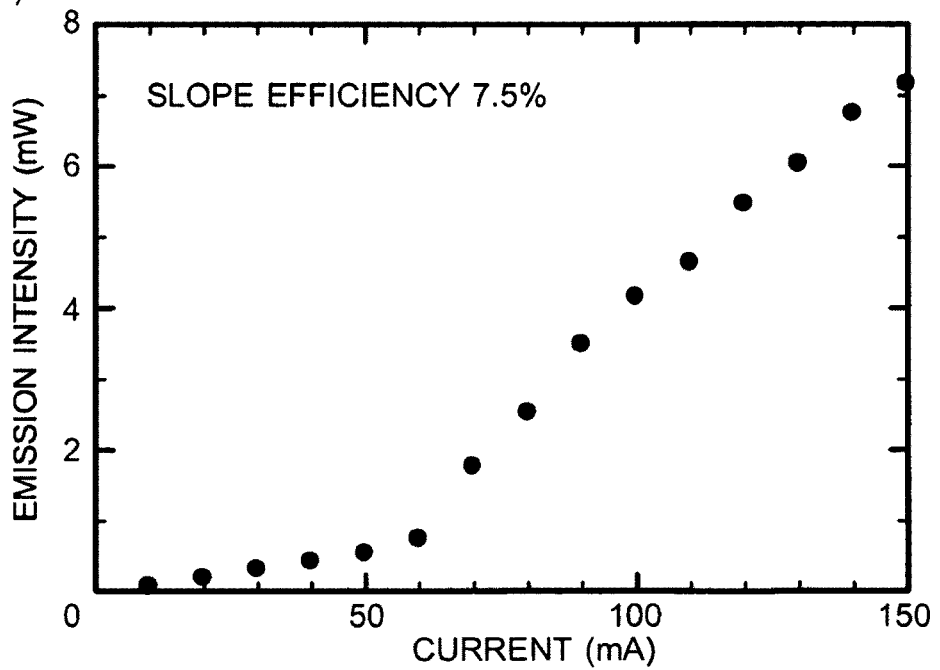

SURFACE-EMITTING LASER LIGHT SOURCE USING TWO-DIMENSIONAL PHOTONIC CRYSTAL

This is a Division of application Ser. No. 11/991,403 filed Apr. 4, 2008, which in turn is a National Phase of PCT/JP2006/317486 filed Sep. 5, 2006. The disclosure of the prior applications is hereby incorporated by reference herein in its entirety.

TECHNICAL FIELD

The present invention relates to a surface-emitting laser light source for emitting laser light in a direction perpendicular to the surface of a flat light source.

BACKGROUND ART

Conventional laser light sources include a Fabry-Perot laser light source, which uses a Fabry-Perot resonator, and a distributed feedback (DFB) laser light source, which uses a diffraction grating. These types of laser light sources produce an oscillation of laser light by amplifying light of a predetermined wavelength through resonation or diffraction.

In recent years, new types of laser light sources using a photonic crystal have been developed. A photonic crystal includes a dielectric matrix body in which an artificial periodic structure is created. Usually, the periodic structure is created by providing the matrix body with a periodic arrangement of areas whose refractive index differs from that of the matrix body (this area is called the "modified refractive index area" hereinafter). The periodic structure causes a Bragg diffraction within the crystal and creates an energy band gap with respect to the energy of light. There are two types of photonic crystal laser light sources: one of which utilizes a band-gap effect to use a point-like defect as a resonator, and the other utilizes a standing wave at a band edge where the group velocity of light becomes zero. Both of them cause an oscillation of laser light by amplifying light of a predetermined wavelength.

Patent Document 1 discloses a laser light source in which a two-dimensional photonic crystal is created in the vicinity of an active layer containing a light-emitting material. This two-dimensional photonic crystal is created from a plate-shape matrix body made of a semiconductor in which cylindrical holes are arranged periodically (in a triangular, square, or hexagonal lattice pattern or similar pattern) and the refractive index of the matrix body is periodically distributed over a two-dimensional area. This period is adjusted so that it equals the wavelength within the medium of light generated in the active layer by injecting carriers from the electrode. Therefore, two-dimensional standing waves are created within the two-dimensional photonic crystal, whereby the light is intensified to realize a laser oscillation.

FIG. 1 schematically shows standing waves created within the two-dimensional photonic crystal disclosed in Patent Document 1. FIG. 1 shows only a one-dimensional aspect of the standing waves in a specific direction (called the "x-direction" hereinafter) within the crystal surface. If, for example, holes are arranged in a square lattice pattern, another standing wave occurs in the direction perpendicular to the x-direction. For the electric field, the standing wave has two modes: the first mode has a node at the holes 12 of the two-dimensional photonic crystal 11, whereas the second mode has an antinode in the same location. For a given hole 12, when an axis ("z-axis) passing through its center is defined as the axis of symmetry, the first mode is anti-symmetric with respect to the z-axis, whereas the second mode is symmetric. From the viewpoint of the coupling to the external plane waves, the distribution function of the plane waves propagating in the z-direction takes a uniform value with respect to the x-direction. In contrast, with respect to the axis of symmetry, the distribution function is an odd function for the anti-symmetric mode or an even function for the symmetric mode. Suppose that the two-dimensional photonic crystal has an infinite size. Then, if the mode is symmetric, the first-order diffracted light is emitted in the direction perpendicular to the surface because the overlap integral between the symmetric waves and the external plane waves is not zero. In the anti-symmetric mode, since the overlap integral between the generated waves and the external plane waves is zero, the emission of the first-order diffracted light in the direction perpendicular to the surface does not occur due to the interference. Thus, the anti-symmetric mode of light cannot be extracted in the direction perpendicular to the surface.

In practice, two-dimensional photonic crystals have a finite size. Therefore, even the anti-symmetric mode of light has its symmetry broken, so that the light can be extracted in the direction perpendicular to the surface. However, even in this case, the intensity of light to be extracted in the direction perpendicular to the surface is weakened by receiving the effects of interference.

In order to suppress such interference effects and improve the efficiency of extracting light in the direction perpendicular to the surface, there have been studies made for breaking the symmetry of a refractive-index distribution within a plane of a two-dimensional photonic crystal. Patent Document 2 discloses a surface-emitting laser light source having a two-dimensional photonic crystal in which the lattice structure has translational symmetry but does not have rotational symmetry so that the symmetry within a plane parallel to the matrix body is broken. For example, this type of symmetric structure can be obtained by arranging holes, which are refractive-index areas, in a square lattice pattern and creating a plane shape (i.e. shape of a cross section disposed in parallel to the two-dimensional photonic crystal) of each hole into an equilateral triangle. In this case, the lattice has four-fold rotational symmetry and the holes have three-fold rotational symmetry, where rotational symmetry is not consistent between them and this suggests that rotational symmetry is not present in the crystal as a whole. There is another method, in which two holes with a plane shape perfectly round and different diameters are adjacently arranged in each lattice point of a square lattice. This method does not provide rotational symmetry in the lattice point, which means the crystal as a whole does not have rotational symmetry. Since the lattice structure of a two-dimensional photonic crystal in these laser light sources has a lower degree of symmetry than the lattice structure of FIG. 1, it is possible to suppress the interference effects of the anti-symmetric mode of light and increase the intensity of light to be extracted in the direction perpendicular to the surface more than conventional intensities of light.

[Patent Document 1] Unexamined Japanese Patent Application Publication No. 2000-332351 (Paragraphs [0037] to [0056], FIG. 1)

[Patent Document 2] Unexamined Japanese Patent Application Publication No. 2004-296538 (Paragraphs [0026] to [0037], FIGS. 1 to 5)

DISCLOSURE OF THE INVENTION

Problem to be Solved by the Invention

As one of many indicators for suggesting the efficiency of laser light sources, there is known a differential quantum efficiency $\eta_d$ in which the denominator refers to an increased amount of a current injected to a laser light source and the numerator refers to an increased amount of outputted light resulting from the increase of the current in the direction perpendicular to the surface. The differential quantum efficiency $\eta_d$ is proportional to a value expressed by:

$$\eta \equiv \frac{1/Q_\perp}{1/Q_\perp + 1/Q_\parallel + \alpha} \quad (1)$$

where $Q_\perp$ is a Q value in the direction perpendicular to the surface, $Q_\parallel$ is a Q value in the side surface direction, and a is a dimensionless factor indicating internal absorption and scattering loss. In order to improve the differential quantum efficiency, it is effective to make $1/Q_\parallel+\alpha$ smaller and $1/Q_\perp$ larger, i.e. to make $Q_\perp$ smaller. However, if $Q_\perp$ is too small, no laser oscillation occurs, so that the $Q_\perp$ value is preferably set in a predetermined range (approx. several thousands). $Q_\perp$ defined here is provided for a two-dimensional photonic crystal having a finitely periodic structure (or finite size). However, the following discussion assumes that $Q_\perp$ is defined for an infinitely periodic structure hereinafter. This assumption facilitates the calculation of $Q_\perp$ yet does not damage the essences of the discussion since $Q_\perp$ of the infinitely periodic structure has a correlation with $Q_\perp$ of the finitely periodic structure.

Moreover, in order to enhance the efficiency of laser light sources, selection of a photonic band for use in a laser oscillation needs to be considered. FIG. 2 shows a photonic band chart of a two-dimensional photonic crystal in which holes are arranged in a square lattice pattern. The two-dimensional photonic crystal has four bands created in the vicinity of k=0 ($\Gamma$ point). Among these four bands, the band edges "A" and "B" of the two bands located on a low-energy side (or low-frequency side) contribute to the laser oscillation. The band edge "B" exhibits a flat dispersion relation in the vicinity of the $\Gamma$ point, which suggests that more light having a wave number other than the $\Gamma$ point is mixed in the finitely periodic structure of actual use. Light having a wave number other than the $\Gamma$ point has a low degree of symmetry and cannot be confined in the direction perpendicular to the surface. Accordingly, the $Q_\perp$ value in actual devices is normally lower in the band edge "B" than the band edge "A", whereby the band edge "A" is used as an oscillation mode. The calculation of FIG. 2 assumed that the plane shape of the holes was elliptic. The result is basically similar even if the holes have a different shape.

The present inventors calculated the Q value of the two-dimensional photonic crystal in the surface-emitting laser light source using the two-dimensional phonic crystal disclosed in Patent Document 2, and revealed that the $Q_\perp$ value for the band edge "B" is as high as approximately several hundred thousands to several millions when the $Q_\perp$ value for the band edge "A" is set to approximately several thousands by appropriately setting the hole size. If the $Q_\perp$ value of the band edge "B" with respect to the band edge "A" is such a large value, a laser oscillation may possibly occur in the band edge "B". As explained earlier, the band edge "A" is normally selected in laser light sources actually used; therefore, if the $Q_\perp$ value of the band edge "B" is large, it may possibly cause an unstable two-mode oscillation. Moreover, if the band edge "B" is selected for an oscillation, the $Q_\perp$ value is too large and thereby the efficiency of extracting light in the direction perpendicular to the surface is reduced.

In addition, the surface-emitting laser light source using the two-dimensional photonic crystal disclosed in Patent Document 2 has the following problems when it is manufactured. According to a normal manufacturing method, a matrix body (or a matrix body with a laminated layer such as an activation layer) of the two-dimensional photonic crystal is first fabricated and subjected to dry etching or other processes to periodically create equilateral triangular prism holes in the material body. Then, respective layers (cladding layer and electrode or the like) including the matrix body are piled and heated to be fused together. In this heating process, corners of the equilateral triangular prism of the holes are occasionally deformed into a round shape close to a cylinder. If this deformation occurs, the round plane shape of the holes has a higher degree of symmetry than the equilateral triangular prism, in which the efficiency of extracting light is reduced.

One objective of the present invention is to provide a surface-emitting laser light source using a two-dimensional photonic crystal which has a high efficiency for extracting light in the direction perpendicular to the surface and is difficult to receive the effects of deformation caused by heat or other factors, and a manufacturing method thereof.

Means for Solving the Problem

A surface-emitting laser light source using a two-dimensional photonic crystal according to the present invention has been achieved to solve the previously mentioned problems and a first aspect thereof includes:

an active layer, and a two-dimensional photonic crystal arranged on one side of the active layer, and which is characterized in that:

the two-dimensional photonic crystal includes a plate-shaped matrix body in which a large number of modified refractive index regions whose refractive index differs from that of the matrix body are periodically arranged, each of the regions has a columnar shape with a predetermined cross-sectional shape, and a main axis of each of the regions is tilted to the surface of the matrix body.

In the first aspect of the surface-emitting laser light source using the two-dimensional photonic crystal, each of the modified refractive index regions may have an obliquely columnar shape whose main axis is tilted to a line perpendicular to the matrix body at 20 to 45 degrees. Alternatively, the modified refractive index regions may be shaped like an obliquely standing equilateral triangular prism which is tilted to the base side of the equilateral triangle of a cross section on the matrix body as advancing from a plane opposite of the active layer toward the active layer.

A second aspect of the surface-emitting laser light source using the two-dimensional photonic crystal according to the present invention includes:

an active layer and a two-dimensional photonic crystal arranged on one side of the active layer, and which is characterized in that:

the two-dimensional photonic crystal is created from a plate-shaped matrix body in which a large number of modified refractive index region groups made of a plurality of regions whose refractive index differs from that of the matrix body are periodically arranged, each of the region groups including at least two regions whose thicknesses differ from one another.

The modified refractive index regions in the modified refractive index region group may have different plane shapes from one another. Each of the modified refractive index regions in the modified refractive index region group is desirably thicker as the area of the plane shape thereof is larger.

The present invention also provides a method for manufacturing the surface-emitting laser source using the two-dimensional photonic crystal according to the aforementioned second aspect of the present invention. Specifically, the present method is:

a method for manufacturing a laser light source having an active layer and a two-dimensional photonic crystal arranged on one side of the active layer, which is characterized in that the two-dimensional photonic crystal is manufactured by a process including:

creating a mask in which a large number of hole groups each including two or more holes with different areas are periodically arranged on a plate-shaped matrix body; and dry etching the matrix body covered with the aforementioned mask and then discontinuing the dry etching before the holes created in the matrix body completely penetrate through the matrix body.

BRIEF DESCRIPTION OF THE DRAWINGS

FIG. 9 shows the calculation results of the electric field distribution in the first embodiment.

FIG. 10 shows the calculation results of the electric field distribution in the second embodiment.

FIG. 11 shows the calculation results of the electric field distribution in the third embodiment.

FIG. 12 shows the calculation results of the electric field distribution in the first comparative example.

FIG. 16 includes a top view (a) and a longitudinal sectional view (b) for showing microscope images of the two-dimensional photonic crystal layer 74 of the laser light source fabricated in the fourth embodiment.

FIG. 17 shows graphs for the result of measuring how a current injected from the electrode of the laser light source in the fourth embodiment (a) and a second comparative example (b) is related to the intensity of light emission.

EXPLANATION OF THE NUMERALS

Figure 1:
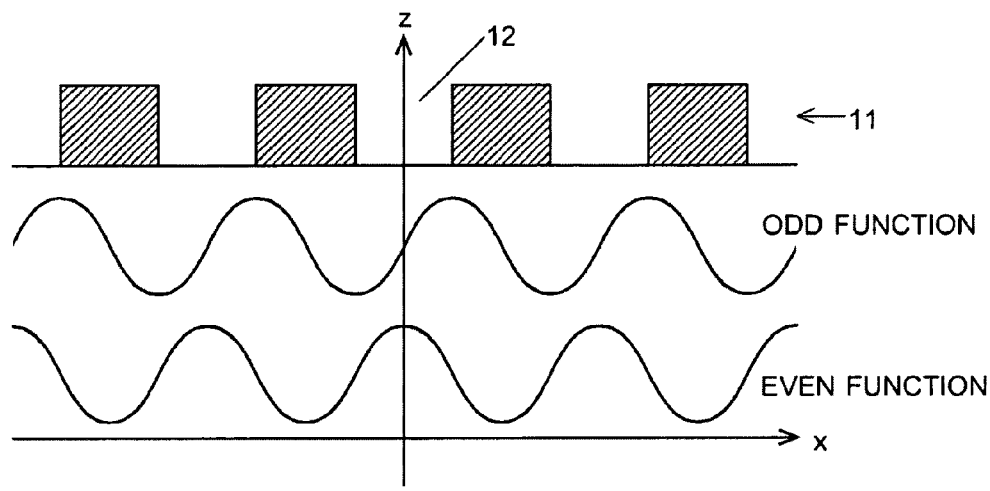
FIG. 1 shows a graph of an anti-symmetric mode and a symmetric mode of a standing wave inside a two-dimensional photonic crystal.
Figure 2:
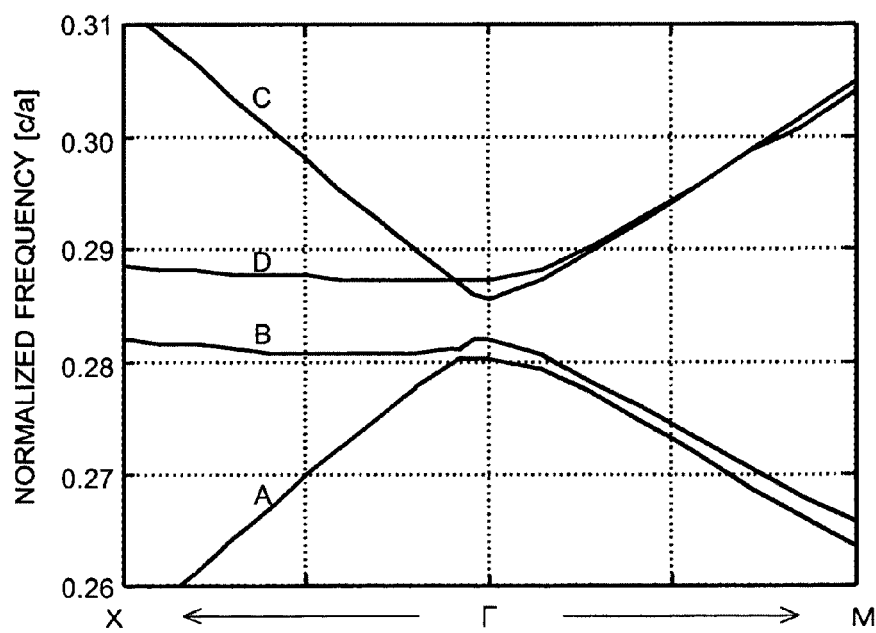
FIG. 2 shows graphs of photonic band examples in the two-dimensional photonic crystal.

11 . . . Two-Dimensional Photonic Crystal
12, 25, 45, 55, 65 . . . Hole
21 . . . Anode
22 . . . Cathode
23 . . . Active Layer
24, 74 . . . Two-Dimensional Photonic Crystal Layer
261, 262, 263 . . . Spacer Layer
271, 272 . . . Cladding Layer
28 . . . Contact Layer
31 . . . Main Axis
61 . . . Plane of Hole 65 Including Bottom Plane on Active Layer 23
62 . . . Plane of Hole 65 in Parallel to and within Active Layer 23
661 . . . Hole Area in the Vicinity of Edge on Negative Side in x-Direction
662 . . . Hole Area in the Vicinity of Edge on Positive Side in x-Direction
67 . . . Node
68 . . . Center of Gravity
75 . . . Modified Refractive Index Region Group
751 . . . First Hole
752 . . . Second Hole
81 . . . Matrix body
82 . . . First Laminate
83 . . . Resist
841 . . . Rectangular Hole
842 . . . Circular Hole
85 . . . Second Laminate

MODES FOR CARRYING OUT THE INVENTION AND THEIR EFFECTS

A first aspect of a surface-emitting laser light source using a two-dimensional photonic crystal (referred to as a "laser light source" hereinafter), and a second aspect of a laser light source are now explained in detail.

First, components common to the laser light source according to the present invention are explained. In the laser light source according to the present invention, the two-dimensional photonic crystal is provided on one side of the active layer. The two-dimensional photonic crystal does not need to be in direct contact with the active layer; it is possible to place a spacer or other members between them. The active layer may be the same as those conventionally used in Fabry-Perot laser light sources. The two-dimensional photonic crystal is created from a plate-shaped matrix body in which a large number of modified refractive index regions whose refractive index differs from that of the matrix body are periodically arranged. It is possible to create the modified refractive index regions by embedding certain members whose refractive index differs from that of the matrix body into the matrix body, but the modified refractive index regions are desirably created by arranging holes in the matrix body, because this design provides a larger difference in refractive index from that of the matrix body and is easier to manufacture.

The first aspect and the second aspect use inventive shapes applied to the modified refractive index regions as described hereafter in order to increase the efficiency of extracting light and make it difficult to receive the effects of deformation caused by heat or other factors.

1) First Aspect of Laser Light Source

In the first aspect of the laser light source, the modified refractive index regions are columnar with a predetermined cross-sectional shape, and the main axis of each of the columnar regions is tilted to the surface of the matrix body. The "columnar" in the present application refers to a three-dimensional shape whose cross sections parallel to the layers is uniform and the line connecting the centers of gravity of the cross sections is a straight line. And this line is called the main axis of the column. The modified refractive index regions having such a shape do not have symmetry within a plane disposed in parallel to the matrix body, or more specifically, do not have rotational symmetry around an axis perpendicular to the matrix body.

In a laser light source provided with the two-dimensional photonic crystal having such a modified refractive index region, the emitted light of the anti-symmetric mode is not canceled out even in the central area of the two-dimensional photonic crystal because the modified refractive index region does not have symmetry as stated earlier. Therefore, the efficiency of extracting light in the direction perpendicular to the surface is improved.

Moreover, the first aspect of the laser light source allows suppression of a $Q_{\perp B}$ value which is a $Q_\perp$ value with respect to a band edge "B". The reason is considered as follows. A node of a standing wave created in the photonic crystal and the active layer is disposed in the vicinity of the center of gravity of the modified refractive index region within a plane in parallel to the matrix body. Meanwhile, light has maximum intensity in the active layer, whereby the electric field distribution of light is strongly influenced by the shape of the modified refractive index region which is in the vicinity of a bottom surface closest to the active layer within the photonic crystal. If the modified refractive index region is tilted to a surface of the matrix body, the center of gravity of the bottom surface shape on the active layer side is displaced from a position of the node of the standing wave. Therefore, asymmetrical electric field distribution is created within the bottom surface, where the $Q_\perp$ value decreases. The position of the node is slightly different between the band edge "A" mode and the band edge "B" mode even if they share the same structure of the two-dimensional photonic crystal. That is, displacement of the position of a node from the center of gravity of the bottom surface of the modified refractive index region is more significant in the band edge "B" mode than the band edge "A" mode, whereby the electric filed distribution exhibits stronger asymmetry and the $Q_{\perp B}$ value can be made smaller than the $Q_{\perp A}$ value which is the $Q_\perp$ value with respect to the band edge "A". Therefore, it is possible to suppress the effects of a laser oscillation by the band edge "B" in an area except for the Γ point, and a stable laser oscillation can be obtained by the band edge "A".

An appropriately defined shape of the holes as shown in an example to be described later enables to make the $Q_{\perp B}$ value smaller than the $Q_{\perp A}$ value. Therefore, effects of the band edge "B" can be substantially eliminated.

Both the $Q_\perp$ value and the efficiency of extracting light in the direction perpendicular to the surface are dependent on an angle made by the main axis of a column of each of the modified refractive index regions and the surface of the matrix body, and a sectional shape of the column.

As an example, the case where the refractive index region is obliquely cylindrical is explained. The obliquely cylindrical shape refers to a column whose cross section is circular and whose main axis is tilted to the surface of the matrix body. In the laser light source having the two-dimensional photonic crystal made of the modified refractive index regions of such an obliquely cylindrical shape, when an angle θ made by the main axis and the line perpendicular to the matrix body is set to 20 to 45 degrees, the $Q_{\perp A}$ value can be suppressed to achieve approximately several thousands to ten thousands. Moreover, in this angle range, the $Q_{\perp B}$ value is much smaller than the $Q_{\perp A}$ value. When the $Q_{\perp A}$ value is appropriately small and the $Q_{\perp B}$ value is much smaller than the $Q_{\perp A}$ value, effects of the band edge "B" can be substantially eliminated to allow a stable oscillation of laser light.

In addition to the obliquely columnar shape, there is an obliquely equilateral triangular prism as another example of the shape of the modified refractive index regions according to the present invention. The obliquely equilateral triangular prism refers to a column whose cross-sectional shape is an equilateral triangle and whose main axis is tilted to the surface of the matrix body. The three-dimensional shape of an obliquely equilateral triangular prism as a whole varies dependent on a tilted direction of the main axis, where a relation between the $Q_{\perp A}$ value and the $Q_{\perp B}$ value varies. For example, as advancing from the side opposite of the active layer toward the other side facing the active layer, a relational change between them occurs dependent on whether one corner of the equilateral triangle of the in-plane shape (i) moves to the base side facing the corner, or (ii) moves to the side opposite of the base, even if the tilted angle θ of the main axis remains the same. That is, across the range of wide angles (θ), the (ii) case tends to have the $Q_{\perp B}$ value which is larger than that of the (i) case, where the $Q_{\perp B}$ value exceeds the $Q_{\perp A}$ value. In contrast, the (i) case has a tendency close to that of the obliquely cylindrical shape, or more specifically, the $Q_{\perp A}$ value is about several thousands and the $Q_{\perp B}$ value is much lower than the $Q_{\perp A}$ value. Accordingly, (i) is more desirable than (ii) in the present invention.

Furthermore, even if a slight deformation is observed in such that, for example, corners of the obliquely equilateral triangle prism are rounded by a heating process at the time of fabrication, the first aspect of the laser light source is capable of maintaining the characteristic shape of the modified refractive index regions in which rotational symmetry is not present around an axis perpendicular to the surface of the matrix body. Therefore, reduction in the efficiency of extracting light can be suppressed even if such deformation occurs.

(2) Second Aspect of Laser Light Source

In a second aspect of the laser light source, the two-dimensional photonic crystal has a matrix body in which a large number of modified refractive index region groups are periodically arranged. The modified refractive index region group is made of a plurality of elementary modified refractive index regions, and the modified refractive index region groups create periodic refractive index distribution. That is, periodic refractive index distribution of the two-dimensional photonic crystal in the second aspect of the laser light source is created by arranging the modified refractive index region groups on respective lattice points of, for example, a square or triangular lattice.

At least two of the plurality of the elementary modified refractive index regions belonging to each of the modified refractive index region groups differs from one another in thickness. As long as this condition is satisfied, every elementary modified refractive index region in a modified refractive index region group may have different thicknesses, or some of the elementary modified refractive index regions may have the same thickness. When a thickness in each of the elementary modified refractive index regions is set, the shape of the modified refractive index region group within a cross section in parallel to the matrix body can be changed dependent on a position of the cross section. Therefore, a lower degree of symmetry can be obtained within a plane in parallel to the matrix body, which enables to suppress reduction in the efficiency of extracting laser light caused by cancellation of the anti-symmetric mode resulting from interference.

Furthermore, even if the shape of each of the elementary modified refractive index regions in a modified refractive index region group is slightly deformed by a heating process at the time of fabrication, it does not make all of the elementary modified refractive index regions to have the same thickness. Therefore, it is possible to maintain the characteristic shape of the modified refractive index region group, where reduction in the efficiency of extracting light caused by such deformation can be suppressed.

Although all the elementary modified refractive index regions in a modified refractive index region group may have the same plane shape, each of the elementary modified refractive index regions desirably has a different plane shape in order to provide a lower degree of symmetry within the plane.

It is desirable that the plane shape of an elementary modified refractive index region in a modified refractive index region group has a larger area as the elementary modified refractive index region is thicker. The reason is now explained.

When the two-dimensional photonic crystal is manufactured, in many cases holes are created within the matrix body by using a dry etching method. As the area in the plane shape of a hole to be created is smaller, it is more difficult for an etching gas to penetrate into the hole when the hole is created, which makes the etching speed slower. As a result, each of the holes (or an elementary modified refractive index region) within a modified refractive index region group becomes thicker as the area thereof is larger. That is, when a normal dry etching method is used by simply providing a different area in each of the elementary modified refractive index regions, the modified refractive index region groups according to the present invention can be easily fabricated without requiring special techniques.

However, the dry etching has to be discontinued before the entire group of holes to be created in the matrix body completely penetrate through the matrix body because penetration of the entire group of holes into the matrix body causes all the modified refractive index regions to have the same thickness.

As one of the modified refractive index region groups in the present invention, a modified refractive index region group can be made of: a first modified refractive index region having a substantially rectangular plane shape; and a second modified refractive index region which is substantially circular with a diameter shorter than a long side of the first modified refractive index region, having a smaller area and being thinner than the first modified refractive index region. In order to simplify the manufacturing process or the like, plane shapes of the first modified refractive index region and the second modified refractive index region may be slightly distorted, or corners of the first modified refractive index region of a rectangular shape may be deformed and rounded, as long as the "symmetry-breaking" effect is not impaired. Moreover, in the two-dimensional photonic crystal fabricated by using a dry etching method as stated earlier, the second modified refractive index region is naturally thinner than the first modified refractive index regions when the first modified refractive index region is set to have an area smaller than that of the second modified refractive index region.

The modified refractive index region group including the first modified refractive index region and the second modified refractive index region as previously stated has a plane shape close to a triangle as a whole. That is, the first modified refractive index region constitutes one side of the triangle, whereas the second modified refractive index region constitutes one corner facing that side. It is equivalent to the plane shape of the modified refractive index regions belonging to the two-dimensional photonic crystal for use in the surface-emitting laser disclosed in Patent Document 2. Furthermore, since the present invention provides a different thickness between the first modified refractive index region and the second modified refractive index region, a degree of symmetry in the modified refractive index regions (or groups) is made lower than that of the surface-emitting laser light disclosed in Patent Document 2, so that the reduction in the efficiency of extracting laser light caused by cancellation of the anti-symmetric mode resulting from the interference can be suppressed.

In the modified refractive index region group made of the first modified refractive index region and the second modified refractive index region, even if there is slight deformation caused by the effects of heat applied at the time of manufacturing or other effects, the characteristic plane shape can be maintained in which a long side of the first modified refractive index region corresponds to one side of the triangle and the second modified refractive index region corresponds to one corner facing the side, in addition to maintaining the aforementioned thickness in each of the modified refractive index regions. Therefore, it is possible to suppress the reduction in the efficiency of extracting light caused by deformation of the modified refractive index regions.

EMBODIMENTS (1) First Embodiment

One Example of the First Aspect of the Surface-Emitting Laser

Figure 3:
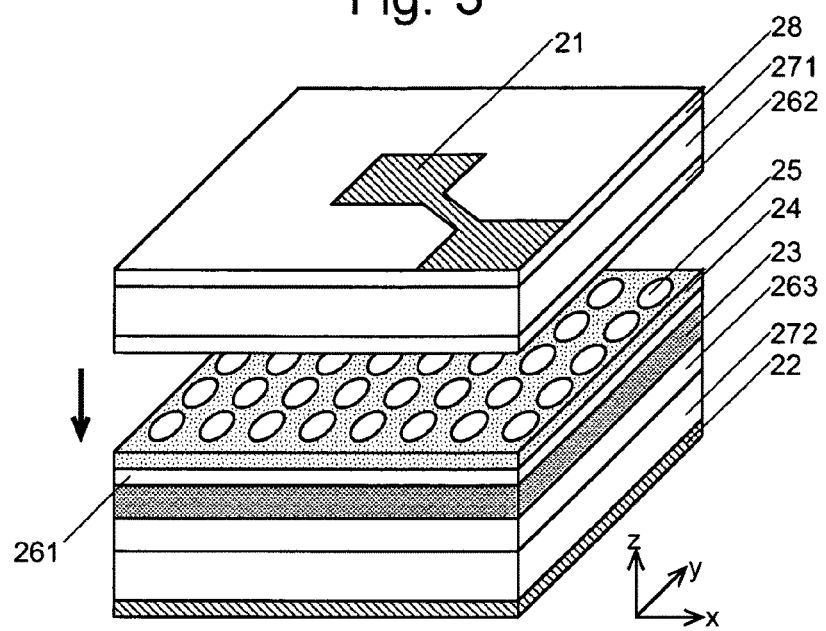
FIG. 3 is a perspective view of a laser light source according to a first embodiment (or one embodiment of a first aspect of the surface-emitting laser).
Figure 4:
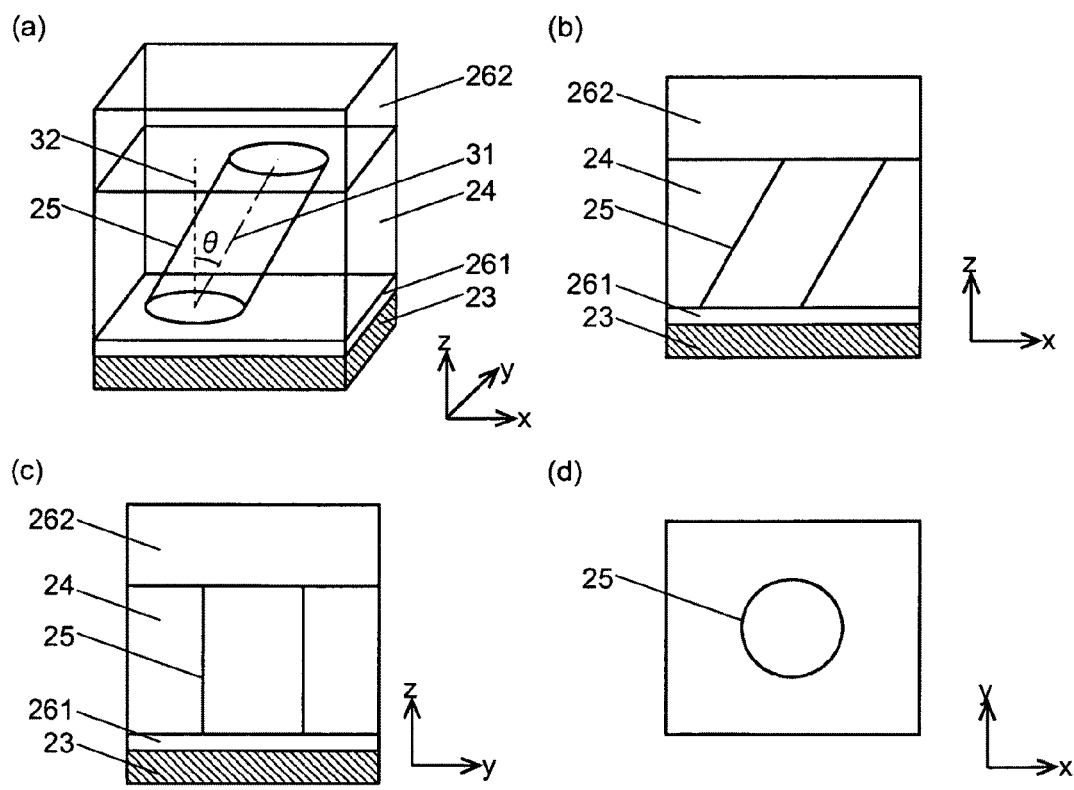
FIG. 4 includes a perspective view, projection views and a sectional view for showing the shapes of a hole 25 in the first embodiment.
Figure 5:
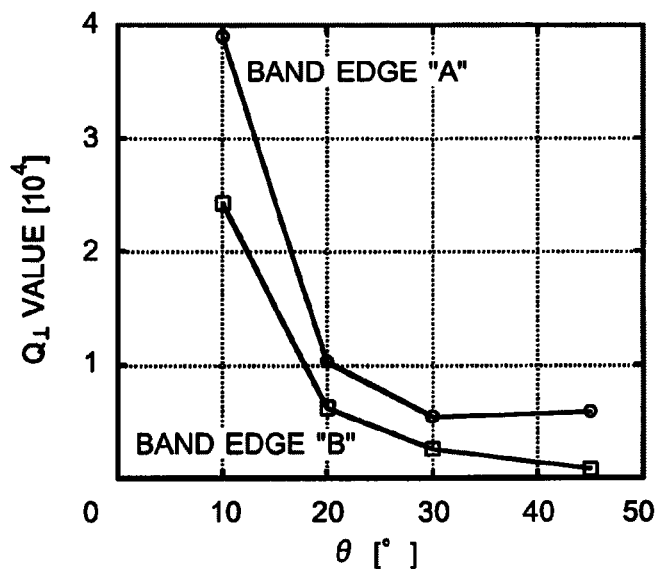
FIG. 5 shows a graph of the calculation result of the $Q_{LA}$ value and the $Q_{LB}$ value in the laser light source of the first embodiment.

As a first embodiment of the laser light source according to the present invention, one example of the first aspect of the surface-emitting laser light is explained referring to FIGS. 3 to 5.

In the laser light source of the present embodiment as shown in FIG. 3, an active layer 23 made of Indium Gallium Arsenide (InGaAs)/Gallium Arsenide (GaAs) and having multiple quantum wells (MQW) is provided between an anode 21 and a cathode 22. A two-dimensional photonic crystal layer 24 made of p-type GaAs is formed on the active layer 23 via a spacer layer 261, which is also made of p-type GaAs. The two-dimensional photonic crystal layer 24 includes a plate member having holes 25 periodically arranged in a square lattice pattern. The shape of the holes 25 is described later. In the example of FIG. 3, the spacer layer 261 and the two-dimensional photonic crystal layer 24 are integrally created as a single layer, in which the holes 25 are present only in the two-dimensional photonic crystal layer 24 which is on the upper side of the spacer layer 261. A spacer layer 262 made of p-type GaAs, a cladding layer 271 made of p-type AlGaAs and a contact layer 28 made of p-type GaAs are provided between the active layer 23 and the anode 21. A spacer layer 263 made of n-type GaAs and a cladding layer 272 made of n-type AlGaAs are provided between the active layer 23 and the cathode 22. In FIG. 3, the spacer layer 262 is separated from the two-dimensional photonic crystal layer 24 in order to show the structure of the two-dimensional photonic crystal layer 24.

As shown in FIG. 3, a coordinate system is defined here by setting one direction of the square lattice formed by the holes 25 as an x-axis, the other direction thereof as a y-axis, and a direction perpendicular to the two-dimensional photonic crystal layer 24 as a z-axis. In the present embodiment, the main axis is tilted to the x-axis. A direction from the active layer 23 toward the two-dimensional photonic crystal layer 24 is also set as a positive direction of the z-axis.

FIG. 4 shows a perspective view, a sectional view and projection views for the shape of a single hole 25. FIG. 4(a) is a perspective view, FIG. 4(b) is a projection view to the x-z plane, FIG. 4(c) is a projection view to the y-z plane, and FIG. 4(d) is a sectional view (or plan view) on the surface of the two-dimensional photonic crystal layer 24 disposed on the spacer layer 262. As shown in FIG. 3, a large number of the holes 25 having the same shape are actually arranged in the two-dimensional photonic crystal layer 24 in a square lattice pattern. In FIG. 4(a), the two-dimensional photonic crystal layer 24 and the spacer layer 262 are depicted in a transparent form in order to show the shape of the hole 25.

As shown in the plan view of FIG. 4(d), the plane shape of the hole 25 on the x-y plane is circular, and this plane shape remains the same in any cross sections disposed in parallel to the surface regardless of the z-values. Since the main axis of the hole 25 is tilted to the x-axis direction, a shape is provided in such a way that this circle moves to the positive direction of the x-axis as the cross section moves to the positive direction of the z-axis. That is, as shown in FIGS. 4(a) and 4(b), an upper portion (or positive direction of the z-axis) of the main axis 31 is tilted to the positive direction of x. It should be noted that the main axis 31 is not tilted to the y-direction as shown in FIG. 4(c).

An operation of the laser light source in the present embodiment is basically similar to that of a conventional surface-emitting laser light source using a two-dimensional photonic crystal. When a voltage is applied between the anode 21 and the cathode 22, positive holes from the anode 21 and electrons from the anode 22 are injected to the active layer 23 respectively to emit light by the recombination of the positive holes and electrons. This light receives feedback from the two-dimensional photonic crystal layer 24, whereby a laser oscillation occurs. This laser light is extracted from the contact layer 28 (or the emission surface) to the outside.

FIG. 5 shows the calculation results of the $Q_{LA}$ value and the $Q_{LB}$ value when θ is 10, 20, 30 and 45 degrees in the laser light source according to the present embodiment. Calculation was made in this situation by a three-dimensional FDTD method for the two-dimensional photonic crystal layer 24 which has an infinitely periodic structure to expand infinitely in the x-y plane, and an 18% ratio of the volume (i.e. filling factor) occupied by the holes 25 in the two-dimensional photonic crystal layer 24. It should be noted that the $Q_{LA}$ value and the $Q_{LA}$ value are both infinite when 0 is 0 degrees, though it is not shown in FIG. 5.

The calculation results show that the $Q_{LA}$ value takes several thousands to ten thousands as a preferable value in a laser oscillation within a range of θ=20 to 45 degrees. The $Q_{LB}$ value is smaller than the $Q_{LA}$ value entirely in the calculated ranges (the $Q_{LB}$ is about 60% of the $Q_{LA}$ value in θ=20 degrees and about 20% of the $Q_{LA}$ value in θ=45 degrees). These calculation results suggest that a laser oscillation by the band edge "A" can be obtained in the laser light source of the present embodiment at least when θ is in the range of 20 to 45 degrees.

(2) Second Embodiment and Third Embodiment

Other Examples of the First Aspect of the Surface-Emitting Laser

Figure 6:
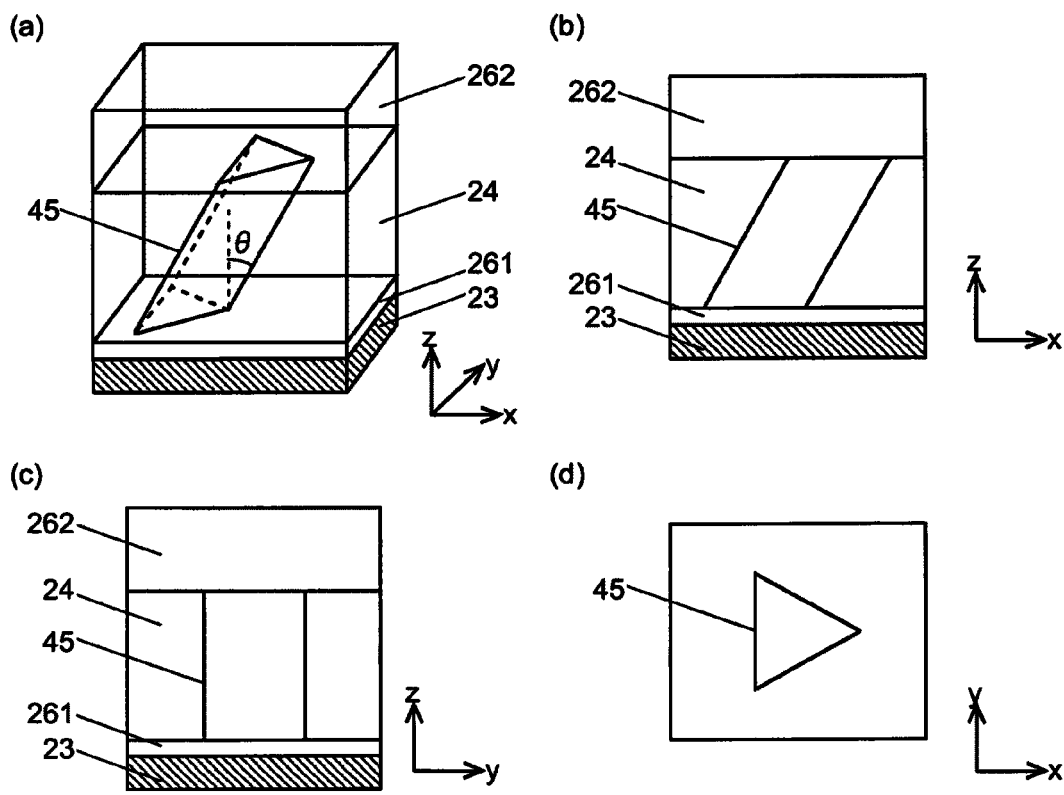
FIG. 6 includes a perspective view, projection views and a sectional view for showing the shape of a hole 45 in a second embodiment.
Figure 7:
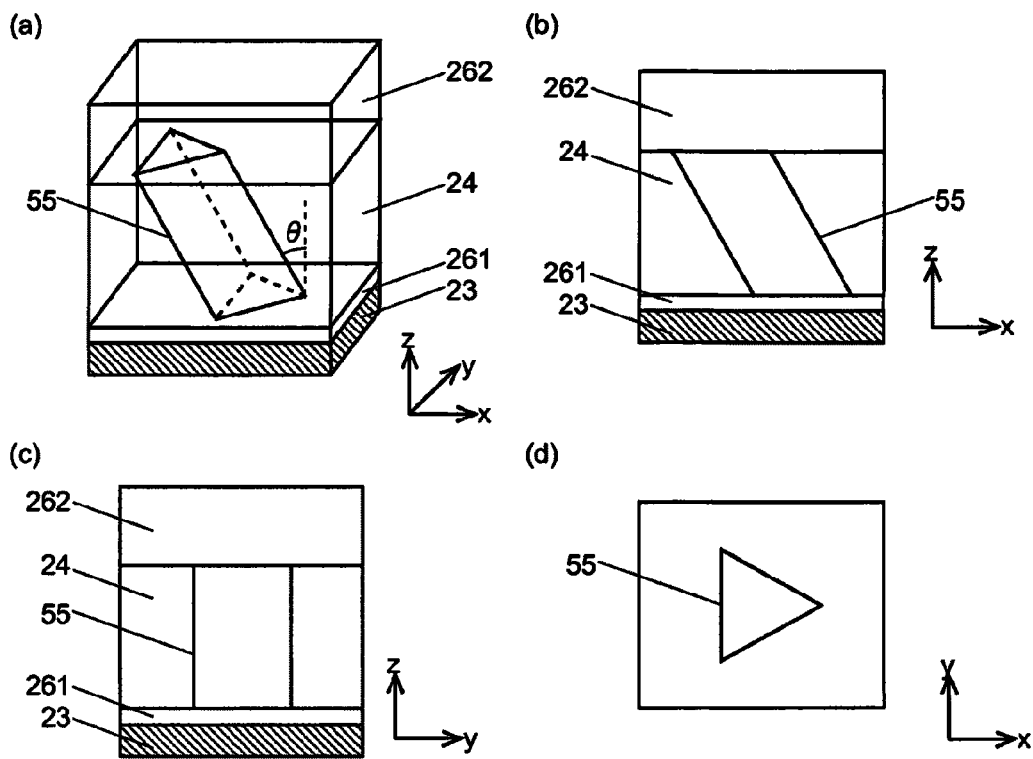
FIG. 7 includes a perspective view, projection views and a sectional view showing the shape of a hole 55 in a third embodiment.
Figure 8:
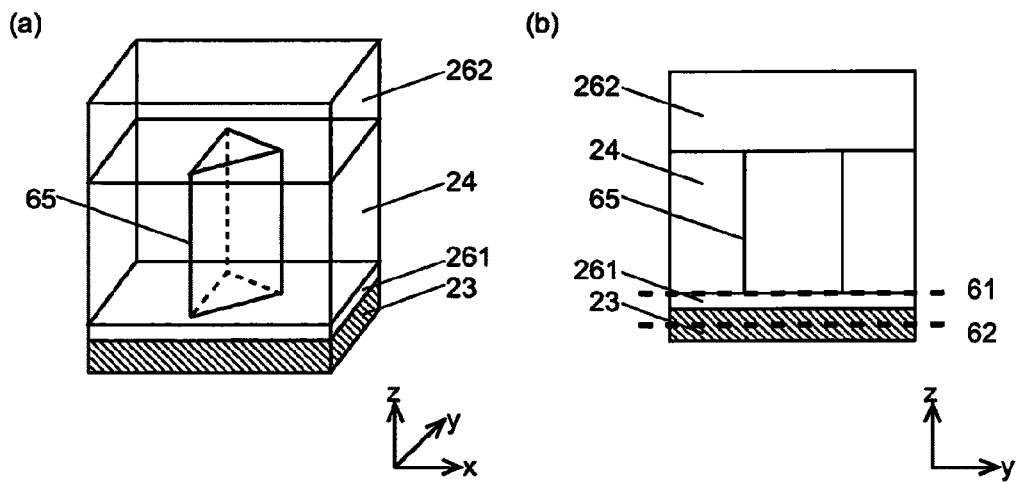
FIG. 8 includes a perspective view for showing the shape of a hole 65 of a first comparative example, and a sectional view for showing a plane in which electric field distribution was calculated.

Next, the second and third embodiments of the laser light source according to the present invention are explained referring to FIGS. 6 and 7. The laser light sources in these embodiments have a structure similar to that of the laser light source of the first embodiment shown in FIG. 3 with the exception of the shape of the holes.

FIG. 6 shows the shape of a hole 45 in the second embodiment and FIG. 7 shows the shape of a hole 55 in the third embodiment. In both FIGS. 6 and 7, (a) is a perspective view, (b) is a protection view to the x-z plane, (c) is a projection view to the y-z plane, and (d) is a sectional view (or plan view) on the surface of the two-dimensional photonic crystal layer 24 disposed on the spacer layer 262. As in the case of FIG. 3, a large number of holes having the same shape are actually arranged in a square lattice pattern in the two-dimensional photonic crystal layer 24, though the holes 44 and 45 are shown as a single hole in FIGS. 6 and 7.

In both the second embodiment and the third embodiment, the plane shape of the holes on the x-y plane is an equilateral triangle as shown in the plan views of FIG. 6(d) and FIG. 7(d), in which one of the three corners is directed to the positive direction of the x-axis. This plane shape remains the same at any cross sections disposed in parallel to the above surface regardless of the z-values.

The second embodiment differs from the third embodiment as follows. The hole 45 in the second embodiment has a shape such that the aforementioned one corner moves toward the base side of the equilateral triangle as advancing from the side opposite of the active layer 23 to the other side facing the active layer 23 (or to the negative direction of z). In other words, the equilateral triangle moves to the positive direction of x as a cross section disposed in parallel to the x-y plane moves to the positive direction of z. Accordingly, as shown in FIGS. 6(a) and 6(b), the hole 45 has a shape whose upper portion is tilted to the positive direction of x. On the contrary, the hole 55 in the third embodiment has a shape such that the aforementioned one corner moves away from the base of the equilateral triangle as advancing from the side opposite of the active layer 23 to other side facing the active layer 23. In other words, the equilateral triangle moves to the negative direction of x as a cross section disposed in parallel to the x-y plane moves to the positive direction of z. Accordingly, as shown in FIGS. 7(a) and 7(b), the hole 55 has a shape whose upper portion is tilted to the negative direction of x.

In the laser light sources of the second embodiment and the third embodiment, the $Q_{LA}$ value and the $Q_{LB}$ value have been calculated by a three-dimensional FDTD method when a tilted angle θ is 30 degrees and a filling factor is 16%. As a result, the $Q_{LA}$ value was 4095 and the $Q_{LB}$ value was 2581 in the second embodiment, whereas the $Q_{LA}$ value was 5849 and the $Q_{LB}$ value was 26200 in the third embodiment. These results show that both the second embodiment and the third embodiment have the $Q_{LA}$ value of several thousands, which is appropriate for a laser oscillation. Meanwhile, the $Q_{LB}$ value can be suppressed to be lower than the $Q_{LA}$ value in the second embodiment but the $Q_{LB}$ value is higher than the $Q_{LA}$ value in the third embodiment (though the $Q_{LB}$ value can be made smaller by one to two digits than that of Patent Document 2). Therefore, for a selective laser oscillation by the band edge A, the structure of the second embodiment is more desirable than that of the third embodiment.

(3) Comparison Among First to Third Embodiments

Next, FIGS. 8 to 12 are used to explain the calculation results of the electric field distribution inside the two-dimensional photonic crystal and the active layer in the laser light sources of the first (or θ=30 degrees) to the third embodiments, describing how the results are related to the $Q_{LA}$ value and the $Q_{LB}$ value in these embodiments. As a comparative example, a similar calculation was made for a laser light source (i.e. first comparative example) having a two-dimensional photonic crystal in which a triangular prism hole 65 whose main axis is disposed in parallel to the z-axis and not tilted to the surface of the matrix body as shown in FIG. 8(a) is arranged in a square lattice pattern. Moreover, the calculation of the electric field distribution was made in a plane 61 including a bottom surface of the hole 65 disposed on the active layer 23, and in a plane 62 disposed within and in parallel to the active layer 23 as shown in FIG. 8(b).

The calculation results of the electric field distribution are shown in FIG. 9 for the first embodiment, in FIG. 10 for the second embodiment, in FIG. 11 for the third embodiment, and in FIG. 12 for the first comparative example. In each of these diagrams, (a) shows an electric field of the band edge "A" in the plane 61, (b) shows an electric field of the band edge "B" in the plane 61, (c) shows an electric field of the band edge "A" in the plane 62, and (d) shows an electric field of the band edge "B" in the plane 62. The length and direction of the arrows in each of the drawings indicate the magnitude and direction of an electric field within the x-y plane.

In these drawings, the y-directional component Ey of an electric field vector is discussed. First, (a) and (b) of FIGS. 9 to 12 are used to compare an area 661 in the vicinity of the edge on the negative side of the x-direction with an area 662 in the vicinity of the edge on the positive side of the x-direction in the hole. In the band edge "B" of the third embodiment and the first comparative example, Ey is substantially antisymmetric between the area 661 and the area 662. In these cases, the Q value exceeds 10000. In contrast, there is no such symmetry observed in the band edge "A" of the entire examples and the band edge "B" of the first and second embodiments. In these cases, the Q value takes a value of several thousands. That is, symmetry reduction in the electric field is correlated to reduction of the Q value.

Next, in (c) and (d) of FIGS. 9 to 12, both band edges "A" and "B" have Ey which becomes zero in a node 67 extending in the y-direction in any of the first to third embodiments and the first comparative example. The Q value tends to become smaller as this node 67 is positioned away from the center of gravity of a cross section of the hole in the plane 61. For example, in the first embodiment, the node 67 is positioned away from the center of gravity (or center of circle) of the hole 25 in the plane 61 in the band edge "B" in comparison with the band edge "A", where the $Q_{LB}$ value is smaller than the $Q_{LA}$ value.

Similarly, when the electric field distribution in the band edge "B" is compared between the second embodiment and the third embodiment, the distance between the center of gravity 68 and the node 67 in the plane 61 of the hole is longer in the second embodiment than the third embodiment, where the $Q_{LB}$ value of the third embodiment is smaller than the $Q_{LB}$ value of the second embodiment. It is likely that the difference between the second embodiment and the third embodiment is brought by x-direction symmetry which is made smaller because the node 67 is displaced to a direction of narrowing a width of the y-direction of the hole (or positive direction of x) in the second embodiment, in addition to the effects of the distance between the center of gravity 68 and the node 67. Since this node 67 is created in a position close to the volume center an entire hole (i.e. the center of gravity of an entire hole) within the x-y plane, it can be said that the difference in the $Q_{LB}$ value between the second embodiment and the third embodiment is associated with the difference of the holes in the main axis direction.

(4) Fourth Embodiment

Second Aspect of the Surface-Emitting Laser

Figure 13:
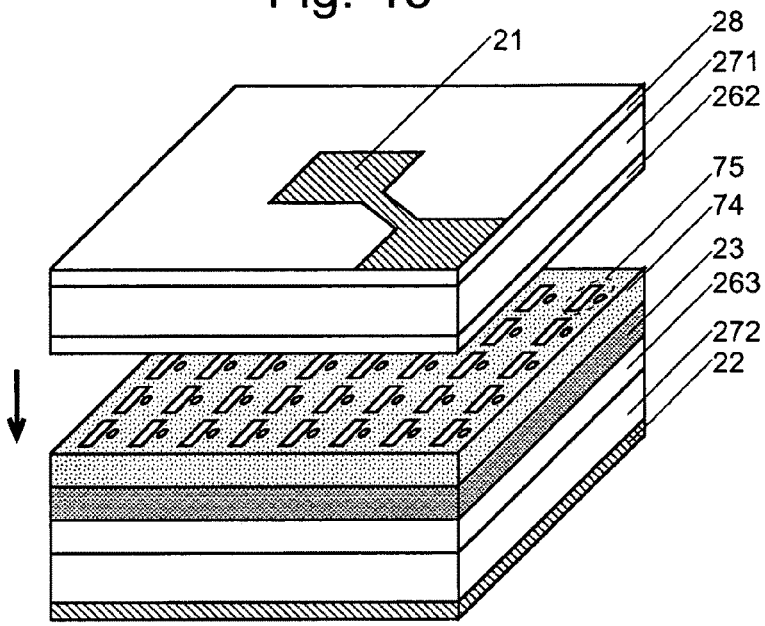
FIG. 13 is a perspective view of a laser light source in a fourth embodiment (or one embodiment of the second aspect of the surface-emitting laser).
Figure 14:
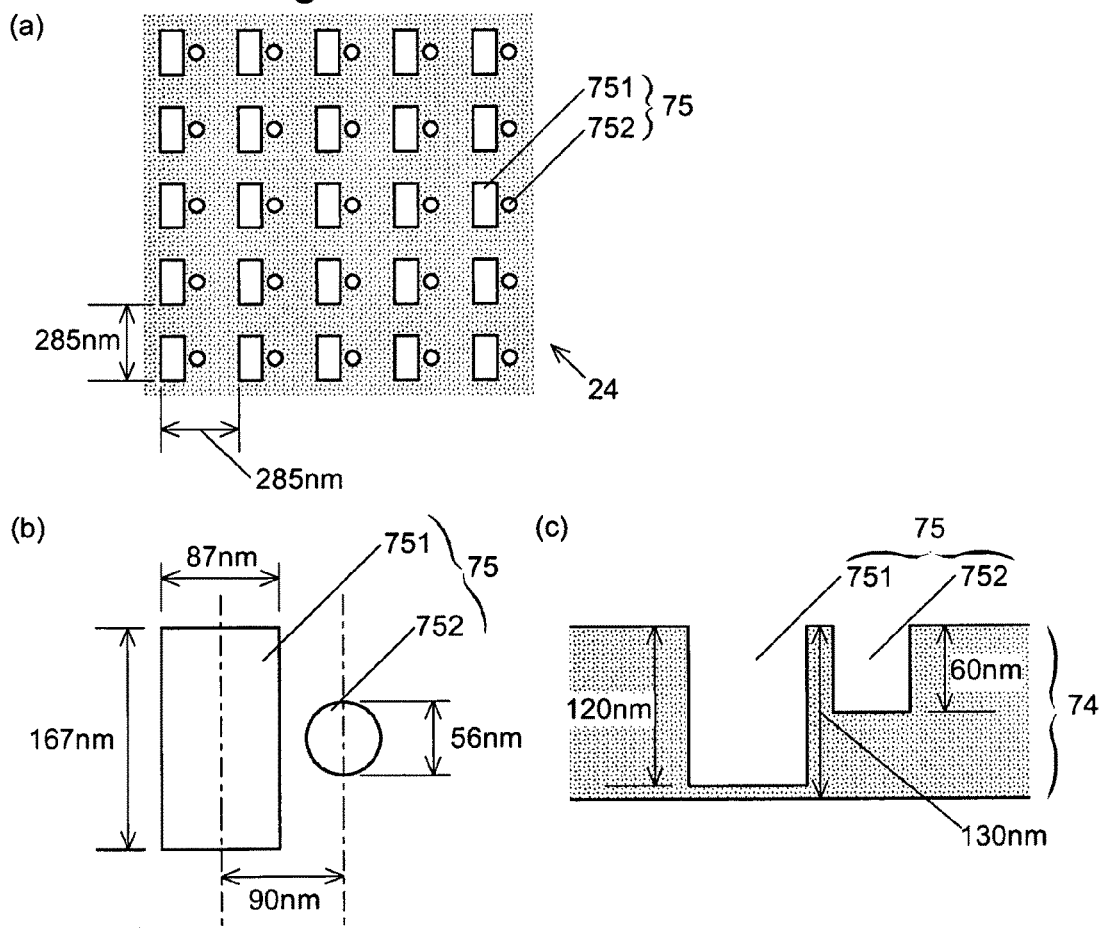
FIG. 14 includes a top view (a) of a two-dimensional photonic crystal layer 74 in the laser light source of the fourth embodiment, as well as an enlarged top view (b) and an enlarged longitudinal sectional view (c) for showing a modified refractive index region group 75.

As a fourth embodiment of the present invention, FIGS. 13 to 19 are used to explain an example of the second aspect of the surface-emitting laser. FIG. 13 is a perspective view showing a laser light source of the present embodiment. This laser light source has a structure similar to that of the laser light source of the first embodiment except for a two-dimensional photonic crystal layer 74. The structure of the two-dimensional photonic crystal layer 74 is now explained.

FIG. 14(a) is a top view of the two-dimensional photonic crystal layer 74. The two-dimensional photonic crystal layer 74 is created from a slab-shaped matrix body made of p-type GaAs with a thickness of 130 nm in which modified refractive index region groups 75 are arranged in a square lattice pattern with a period of 285 nm. FIGS. 14(b) and 14(c) are a top view and a longitudinal sectional view of one of the modified refractive index region groups 75, respectively. The modified refractive index region group 75 includes a first hole 751 and a second hole 752 which are created by perforating the matrix body. The first hole 751 has a rectangular shape with a long side of 167 nm, a short side of 87 nm, and a thickness of 120 nm, whereas the second hole 752 has a columnar shape with a diameter of 56 nm and a thickness of 60 nm. The second hole 752 is arranged adjacent to the long side of the first hole. A distance between their centers is 90 nm. A ratio (or filling factor) of the volume occupied by the first hole 751 and the second hole 752 in the two-dimensional photonic crystal layer 74 is 0.18.

Figure 15:
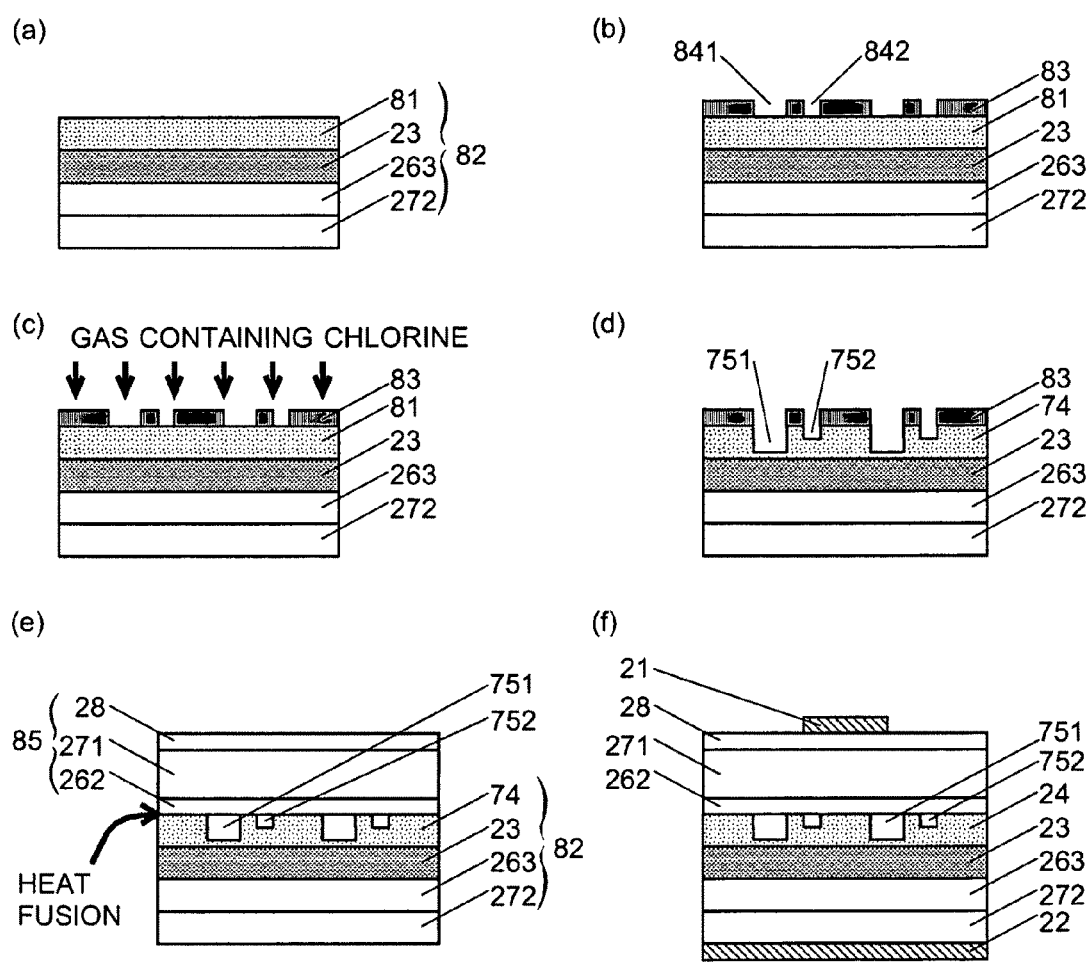
FIG. 15 includes longitudinal sectional views for showing a method to manufacture the laser light source of the fourth embodiment.

A method to manufacture the laser light source of the present embodiment is explained referring to FIG. 15.

First, a first laminate 82 is created by laminating a cladding layer 272, a spacer 262, an active layer 23, and a matrix body 81 made of p-type GaAs in this order using a normal MOCVD method or similar method (FIG. 15(a)). Next, a resist 83 is created on the matrix body 81, where a hole 841 of a rectangular plane shape with a long side of 167 nm and a short side of 87 nm and a hole 842 of a circular plane shape with a diameter of 56 nm are created in the resist 83 by a process such as an electron beam exposure process and a nano-imprinting process so as to correspond to positions in which the first hole 751 and the second hole 752 are arranged. Thereafter, an etching gas containing chlorine is introduced on the resist 83 (FIG. 15(c)). The matrix body 81 is dry-etched by the etching gas through the rectangular hole 841 and the circular hole 842 respectively. This dry etching is carried out for a predetermined period of time in order to create the first hole 751 having a predetermined thickness under the rectangular hole 841 and a second hole 752, which is thinner than the first hole 751, under the circular hole 842. The two-dimensional photonic crystal layer 74 is thus fabricated (FIG. 15(d)). The reason why the first hole 751 and the second hole 752 are created with different thicknesses is explained later. The aforementioned predetermined period of time is obtained by preliminary experiment. After the dry etching is completed, the resist 83 is removed.

In addition to the first laminate 82, a second laminate 85 is created by laminating a spacer layer 261, a cladding layer 271, and a contact layer 28 in this order by using a normal MOCVD method or a similar method. The two-dimensional photonic crystal layer 74 is set on the spacer layer 261, and they are fused together by a heating process at temperatures between 200 to 700 degrees Celsius (FIG. 15(e)). Lastly, an anode 21 is deposited onto the surface of the contact layer 28 and the cathode 22 is deposited onto the surface of the cladding layer 272, whereby the laser light source of the present embodiment is completed (FIG. 15(f)).

The reason why the first hole 751 and the second hole 751 are created with different thicknesses in the process of FIG. 15(d) is explained. Since the area of the circular hole 842 is sufficiently smaller than the area of the rectangular hole 841 (by about ⅕), it is difficult for an etching gas to penetrate into the circular hole 842 in comparison with the rectangular hole 841. Therefore, the speed of etching to advance from the circular hole 842 is slower than the speed of etching to advance from the rectangular hole 841. Accordingly, an etching depth of the first hole 751 is deeper than that of the second hole 752 when the dry etching is completed, which generates a depth difference between the first hole 751 and the second hole 752.

FIG. 16 shows a top view (a) and a longitudinal sectional view (b) of microscopic images of the two-dimensional photonic crystal layer 74 obtained when the last process (FIG. 15(d)) of the manufacturing method according to the present embodiment is completed. FIG. 16(a) clearly shows that the first hole 751 of a rectangular plane shape and the second hole 752 of a circular plane shape are created. FIG. 16(b) also suggests that the first hole 751 is thicker than the second hole 752.

A relation between a current injected from the electrode and the intensity of light emission was measured in the laser light source of the present embodiment. A similar measurement was also made for a laser light source (i.e. second comparative example) having a structure similar to that of the present embodiment except for a two-dimensional photonic crystal layer created from a matrix body in which columnar holes with a diameter of 110 nm and a height of 100 nm are arranged in a square lattice pattern with a period of 285 nm. FIG. 17(a) shows the measurement result of the present embodiment, and FIG. 17(b) shows the measurement result of the second comparative example. Higher slope efficiency and stronger intensity of light emission can be obtained in the present embodiment than the second comparative example.

Figure 18:
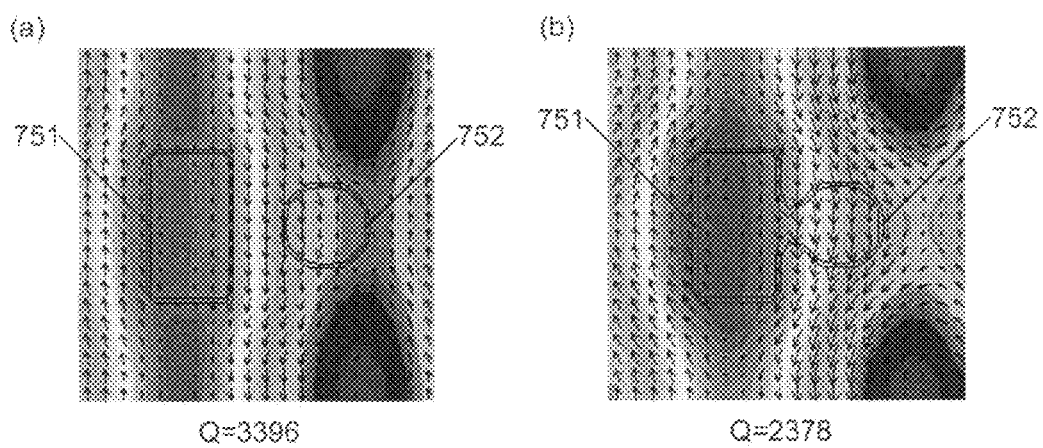
FIG. 18 shows calculation results of electromagnetic field distribution with respect to a band edge "A" within the two-dimensional photonic crystal layer 74 in the laser light source of the fourth embodiment.

The electromagnetic field distribution within the two-dimensional photonic crystal layer 74 of the laser light source in the present embodiment was calculated. This calculation was performed concerning the band edge "A", whose energy in the vicinity of the Γ point (k=0) is lowest among the four bands in the two-dimensional photonic crystal having refractive index distribution of a square lattice pattern. FIG. 18 shows the calculation result. In FIG. 18, the direction of the arrows indicates a direction of an electric field, the length of arrows indicates the intensity of an electric field, and the shading indicates the intensity of a magnetic field. The calculation results shown here are obtained when a distance between the first hole 751 and the second hole 752 is 114 nm (FIG. 18(a)) and when it is 85.5 nm (FIG. 18(b)). The Q value obtained from this electromagnetic field distribution is 3396 in FIG. 18(a) and 2378 in FIG. 18(b). Both values are at the levels of approximately several thousands, which are regarded as suitable for extracting laser light in the direction perpendicular to the surface (e.g. refer to Patent Document 1).

Figure 19:
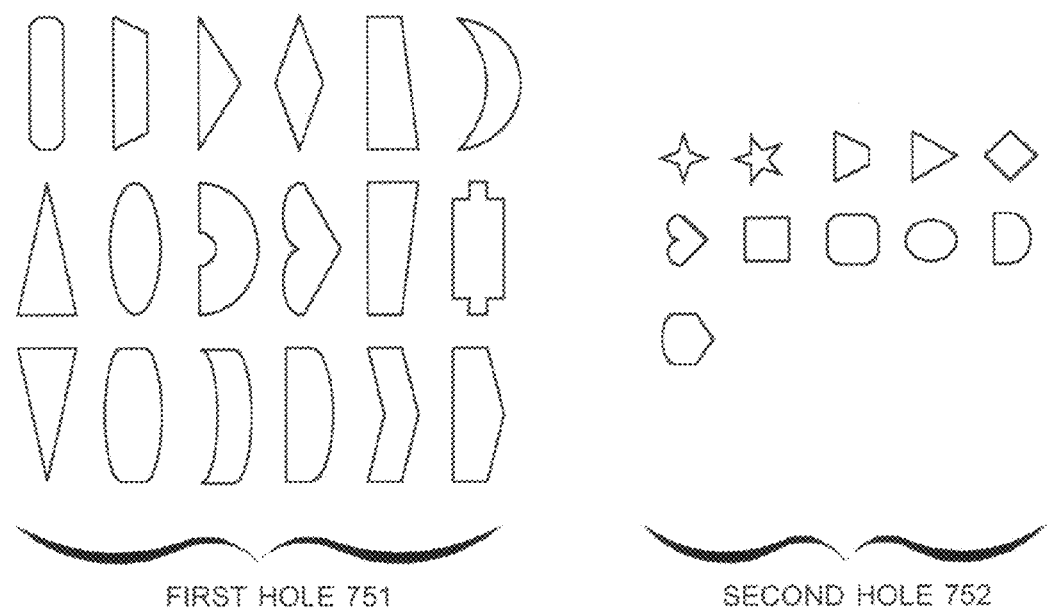
FIG. 19 includes plan views for showing examples in the shape of a first hole 751 and a second hole 752.

Plane shapes of the first hole 751 and the second hole 752 are not limited to the aforementioned shapes. For example, both the first hole 751 and the second hole 752 may have various shapes as shown in FIG. 19 as long as a condition is satisfied in such that the first hole 751 is thicker than the second hole 752 (or the first hole 751 has a larger plane shape than the second hole 752 when the manufacturing method shown in FIG. 15 is used).

The invention claimed is:

1. A surface-emitting laser light source using a two-dimensional photonic crystal, including an active layer and a two-dimensional photonic crystal provided on one side of the active layer,
wherein:
the two-dimensional photonic crystal is created from a plate-shaped matrix body in which a large number of modified refractive index region groups are periodically arranged, and
each of the modified refractive index region groups includes:
a) a first modified refractive index region whose refractive index differs from that of the matrix body; and
b) a second modified refractive index region whose refractive index differs from that of the matrix body, and within the two-dimensional photonic crystal formed from the plate-shaped matrix body having an area smaller and a thickness smaller than the first modified refractive index body.

2. The surface-emitting laser light source using a two-dimensional photonic crystal according to claim 1, wherein the first modified refractive index region and the second modified refractive index region have different plane shapes from one another.

3. The surface-emitting laser light source using a two-dimensional photonic crystal according to claim 2, wherein each of the modified refractive index regions in each of the modified refractive index region groups is thicker as an area of the plane shape thereof is larger.

4. The surface-emitting laser light source using a two-dimensional photonic crystal according to claim 3, wherein the first modified refractive index region has a substantially rectangular plane shape, and the second modified refractive index region has a substantially circular plane shape with a diameter shorter than the long side of the first modified refractive index region.

5. The surface-emitting laser light source using a two-dimensional photonic crystal according to claim 1, wherein the first modified refractive index region and the second modified refractive index region are made of a hole.

6. A method for manufacturing a surface-emitting laser light source using a two-dimensional photonic crystal, the surface-emitting laser light source including an active layer and a two-dimensional photonic crystal provided on one side of the active layer, the method comprising:
forming the two-dimensional photonic crystal from a plate-shaped matrix body in which a large number of modified refractive index region groups are periodically arranged, and forming each of the modified refractive index region groups to include:
a) a first modified refractive index region whose refractive index differs from that of the matrix body; and
b) a second modified refractive index region whose refractive index differs from that of the matrix body, and within the two-dimensional photonic crystal formed from the plate-shaped matrix body having an area smaller and a thickness smaller than the first modified refractive index body.

7. The surface-emitting laser light source using a two-dimensional photonic crystal according to claim 2, wherein the first modified refractive index region and the second modified refractive index region are made of a hole.

8. The surface-emitting laser light source using a two-dimensional photonic crystal according to claim 3, wherein the first modified refractive index region and the second modified refractive index region are made of a hole.

9. The surface-emitting laser light source using a two-dimensional photonic crystal according to claim 4, wherein the first modified refractive index region and the second modified refractive index region are made of a hole.

10. The method for manufacturing a surface-emitting laser light source using a two-dimensional photonic crystal according to claim 6, further comprising:
  creating a mask in which a large number of hole groups each including two or more holes with different areas are periodically arranged on the plate-shaped matrix body;
  dry etching the plate-shaped matrix body covered with the aforementioned mask; and
  discontinuing the dry etching before the holes created in the matrix body completely penetrate through the matrix body, a thickness of a first hole with a first area not exceeding a thickness of a second hole with a second area different from the first area within the two-dimensional photonic crystal formed from the plate-shaped matrix body.

\* \* \* \* \*